United States Patent [19]

Kuroda et al.

[11] Patent Number: 5,187,555
[45] Date of Patent: Feb. 16, 1993

[54] SEMICONDUCTOR INTEGRATED CIRCUIT OF STANDARD CELL SYSTEM

[75] Inventors: Tadahiro Kuroda, Kawasaki; Hiroaki Suzuki, Yokohama, both of Japan

[73] Assignee: Kabushiki Kaisha Toshiba, Kawasaki, Japan

[21] Appl. No.: 765,828

[22] Filed: Sep. 26, 1991

[30] Foreign Application Priority Data

Sep. 28, 1990 [JP] Japan .................. 2-259061

[51] Int. Cl.$^5$ ............................................. H01L 27/02
[52] U.S. Cl. .................................. 257/202; 257/208; 257/210; 257/390; 257/206
[58] Field of Search ............... 357/40, 45, 41, 68, 357/71, 45 M

[56] References Cited

U.S. PATENT DOCUMENTS

| | | | |
|---|---|---|---|
| 4,623,911 | 11/1986 | Pryor | 357/45 |
| 4,910,574 | 3/1990 | Aipperspach et al. | 357/45 X |
| 4,947,229 | 8/1990 | Tanaka et al. | 357/45 |
| 5,063,430 | 11/1991 | Mori | 357/45 |
| 5,095,356 | 3/1992 | Ando et al. | 357/45 |

FOREIGN PATENT DOCUMENTS 0260148  2/1990  Japan .................. 357/45

*Primary Examiner*—William Mintel
*Attorney, Agent, or Firm*—Finnegan, Henderson, Farabow, Garrett and Dunner

[57] ABSTRACT

Transistor elements which are not initially wired are previously arranged in no-cell regions created in part of cell array regions in a standard cell layout according to the layout design. When the circuit is changed in the standard cell layout, a desired circuit is formed in the no-cell region by using the transistor elements which are not initially wired. After the circuit change, an unnecessary circuit is made inoperative. Wiring inhibition regions for inhibiting the normal wiring in the standard cell layout are provided in order to extend the input and output terminals of the desired circuit from the no-cell region to the wiring region.

14 Claims, 6 Drawing Sheets

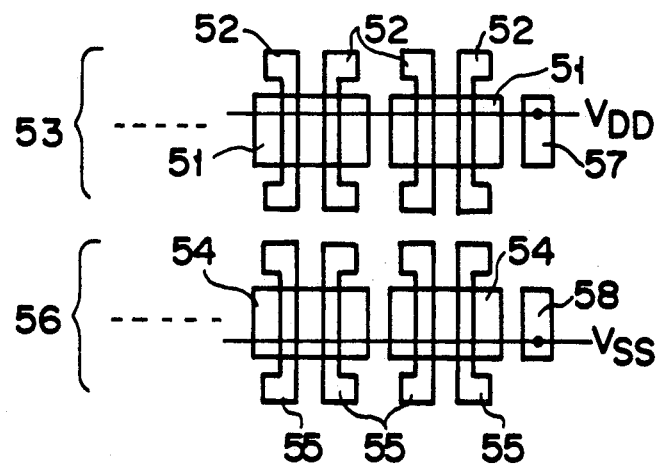
F I G. 6A
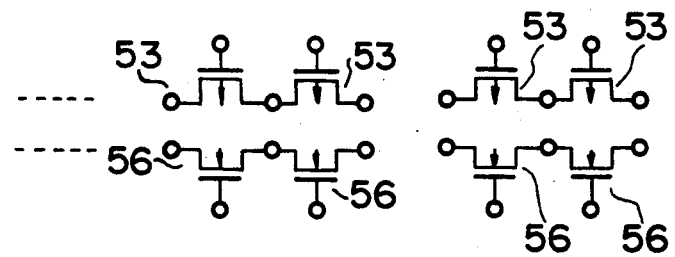
F I G. 6B

SEMICONDUCTOR INTEGRATED CIRCUIT OF STANDARD CELL SYSTEM

BACKGROUND OF THE INVENTION

1. Field of the Invention

This invention relates to a semiconductor integrated circuit of standard cell system having a cell layout whose design can be changed.

2. Description of the Related Art

The layout of cells in a standard cell system is made by use of a design support tool (CAD tool) by a computer.

As shown in FIG. 1, cells 92 necessary for constituting a circuit in a chip 91 are arranged in cell array regions 93 by use of the CAD tool and the cells are connected to each other via wirings 95 by use of wiring regions 94. I/O cells (input/output cells) 96 are arranged in an I/O cell array region 97 and respectively connected to desired cells via the wirings 95.

In the above cell layout, no-cell regions 98 and 99 in which no cells are arranged may occur. The main reason why such no-cell regions 98 and 99 occur is explained in detail below.

First, the area of the wiring region 94 is generally larger than that of the cell array region 93. Therefore, the cell arrangement is made such that the area of the wiring region 94 can be made as small as possible. As a result, in most cases, the sizes of the cell arrays of the cells 92 may become different from each other. Since the chip 91 is formed in a rectangular form, the region in which cells are arranged is defined by a rectangular region determined by the longest cell array, and as a result, no-cell regions 98 may be made on the right and left sides of each cell array.

Secondly, the no-cell regions 99 may sometimes be made not on the right and left sides of each cell array, but inside the cell array. Such a case may occur when no-cell regions 99 previously prepared at the cell arranging stage are not eventually used as wiring tracks at the wiring stage because of the presence of vertically crossing wirings.

In either case, only power source lines 100 for applying potentials to the cells can be arranged in the no-cell regions 98 and 99 in the prior art.

In the development of LSI, it is frequently necessary to change the design after the layout design is completed. In the development of complicated systems, it is extremely difficult to prevent occurrence of bugs (erroneous operations of the system). The bugs may be detected by evaluating experimental chips or by performing extensive simulations. In either case, it is frequently necessary to change the design in order to prevent the occurrence of bugs after the layout of the semiconductor chip is completed.

Further, it is sometimes necessary to change the design when the product standard or part of the specification is changed. In addition, the timing of signals is frequently adjusted by inserting a delay circuit. In most cases, the above design changes can be attained by partial modification of the circuit or addition of a circuit. In this case, if the above design changes can be attained by partial modification of the circuit or addition of a circuit without changing a large portion of the chip layout which has been already designed, it is preferable to do so instead of making a new layout design from the beginning because time and labor used for creating the design are not wasted. For example, when the layout of the chip is changed, the parasitic capacitance and resistance of the wiring are generally changed, causing the propagation delay to be changed, and requiring execution of simulations for checking whether a desired operation is correctly effected or not. If the design change can be attained by partial modification of the layout, verification can be made only by executing the simulation only for the modified portion. Particularly, when the timing of a signal is adjusted by inserting a delay circuit, the wiring layout which has been already made must be kept unchanged.

Further, as the manufacturing mask for forming a semiconductor chip which is required to be corrected by the layout change is used in a later step of the chip manufacturing process, time delay in the product developing schedule and financial burden caused by the design change can be reduced. For example, if the design change can be attained by changing the wiring (metal wiring and contact hole layer), a chip which has been subjected to manufacturing steps immediately before the wiring step may be subjected to the remaining steps according to the design change so that an increase in the time and cost required for the development of the chip can be reduced.

However, in the conventional standard cell design method, the circuit change attained by the wiring change is limited to a method of fixing a node (for example, an input or output terminal of a gate) of the circuit at a power source potential ($V_{DD}$, $V_{SS}$) or setting the same in an electrically floating state.

Since only transistors required for constituting an original circuit are arranged, new cells are additionally arranged and wired when a circuit is added. Therefore, correction of the chip manufacturing masks must be effected substantially in all of the steps starting from a mask used in the initial step of the manufacturing process and a new chip manufacturing process must be effected from the beginning.

Thus, in the prior art, when the design change must be effected after the layout design is completed, the layout design must be effected again from the beginning and a new chip manufacturing process must be effected from the initial step again.

SUMMARY OF THE INVENTION

Accordingly, an object of this invention is to provide a semiconductor integrated circuit of standard cell system for economically and efficiently attaining the design change by effecting a desired circuit change only by changing part of the wiring layout and limiting the chip manufacturing mask correction to a mask or masks used in the wiring step near the final step of the manufacturing process.

The above object can be attained by a semiconductor integrated circuit of standard cell system comprising:

cell array regions and wiring regions in a standard cell layout;

transistor elements which are not wired and are previously arranged in a plurality of no-cell regions provided in part of the cell array regions according to the layout design; and wiring inhibition regions for inhibiting the normal wiring in the standard cell layout, and provided for extending wirings from the no-cell regions to the wiring regions to permit the transistor elements, which are not required in the standard cell layout.

According to the construction of this invention, the transistor elements which are not initially wired or used are previously provided in the no-cell regions provided in the cell array regions of the standard cells. If the circuit change or addition of a circuit becomes necessary at a later stage, the transistor elements which are not initially used and are previously provided are used to constitute a desired circuit which is connected to the circuit inside the standard cell and is thus incorporated into the circuit construction. As a result, a desired design change can be attained only by the wiring change.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a plan view showing a first example of the construction in a no-cell region;

FIG. 6B is a circuit diagram of an equivalent circuit attained by the construction of FIG. 6A;

DETAILED DESCRIPTION OF THE PREFERRED EMBODIMENTS

There will now be described an embodiment of this invention with reference to the accompanying drawings.

Figure 2:
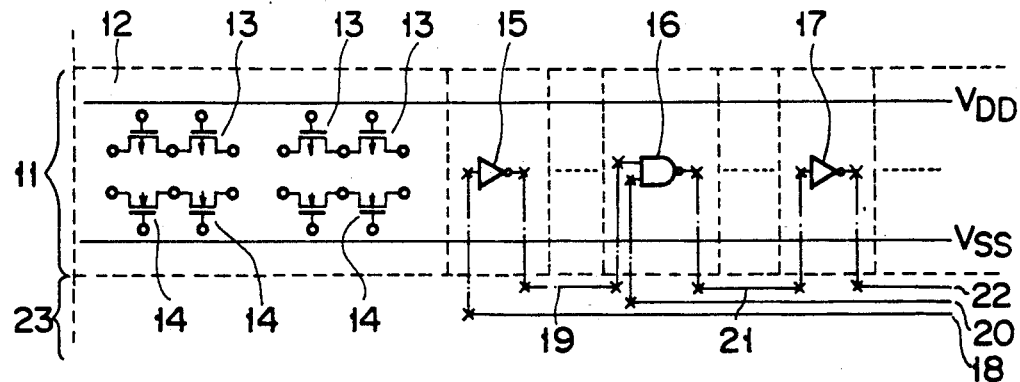
FIG. 2 is a circuit diagram showing the construction of a semiconductor integrated circuit of a standard cell system according to one embodiment of this invention.

FIG. 2 is a circuit diagram showing the construction of a semiconductor integrated circuit of a standard cell system according to one embodiment of this invention.

For example, a no-cell region 12 is arranged on the left end portion of a cell array region 11 in which various gate circuits are arranged. A desired number of P- and N-channel transistors 13 and 14 are previously formed in the no-cell region 12. However, no electrical connection to the source and drain terminals of the transistors is made. Therefore, the transistors 13 and 14 are not electrically operated.

Figure 3:
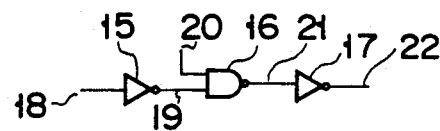
FIG. 3 is a circuit diagram of an equivalent circuit attained by the construction of FIG. 2.

An inverter 15, NAND gate 16 and inverter 17 arranged in the cell array region 11 are cascade-connected to constitute a circuit shown in FIG. 3. In FIG. 2, solid lines indicate first-layered metal wirings, one-dot-dash lines indicate second-layered metal wirings and x marks indicate VIA holes. In FIG. 3, portions corresponding to those of FIG. 2 are denoted by the same reference numerals. Respective nodes are extended to a wiring region 23 (shown in FIG. 2) via the second-layered metal wirings and selectively connected to each other via the first-layered metal wirings.

Figure 4:
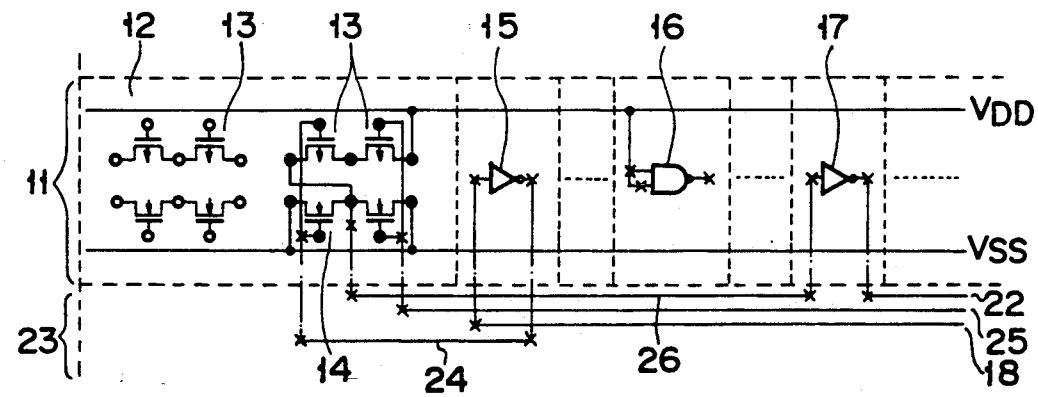
FIG. 4 is a circuit diagram showing the construction of a semiconductor integrated circuit of a standard cell system which has been subjected to the design change according to this invention.

Assume now that it becomes necessary to change the 2-input NAND gate 16 into a 2-input NOR gate for some design reason. In this case, such a circuit change as shown in FIG. 4 can be attained.

First, wirings for the input and output of the NAND gate 16 which become unnecessary are removed, and two input terminals are connected to the power source line ($V_{DD}$ or $V_{SS}$). As a result, the NAND gate 16 is made inoperative. Alternatively, it is also possible to set respective nodes in an electrically floating state and eliminating them from the circuit system by removing the contact holes for the power supply after the wirings for the input and output of the NAND gate 16 are removed.

Next, the sources and drains of the transistors 13 and 14 which are previously formed in the no-cell region are selectively connected to each other via the wirings to constitute a 2-input NOR gate 31 which has become necessary. Then, nodes 19, 20 and 21 which have been connected to the input and output terminals of the NAND gate 16 are now connected to input and output nodes 24, 25 and 26 of the NOR gate 31, respectively. Thus, a modified circuit construction shown in FIG. 5 can be obtained. In this way, a desired circuit change can be attained only by changing part of the wirings of the wiring region.

The construction of a transistor array previously formed in the no-cell region 12 may take various forms, for example, a single MOS transistor or a series circuit of several MOS transistors. An example thereof is described below.

FIG. 6A is a plan view showing a first example of the construction of MOS transistors formed in the no-cell region 12 and FIG. 6B is a circuit diagram showing an equivalent circuit of the construction shown in FIG. 6A. The construction includes an array of a plurality of P-channel MOS transistors 53 each of which is formed of a P-type diffused region 51 and two gate electrodes 52 formed over the P-type diffused region 51 and an array of a plurality of N-channel MOS transistors 56 each of which is formed of an N-type diffused region 54 and two gate electrodes 55 formed over the N-type diffused region 54. N-type diffused regions 57 for supplying the power source voltage $V_{DD}$ are formed in selected portions of the array of the P-channel MOS transistors 53. Likewise, P-type diffused regions 58 for supplying the ground voltage $V_{SS}$ are formed in selected portions of the array of the N-channel MOS transistors 56.

Figure 7A:
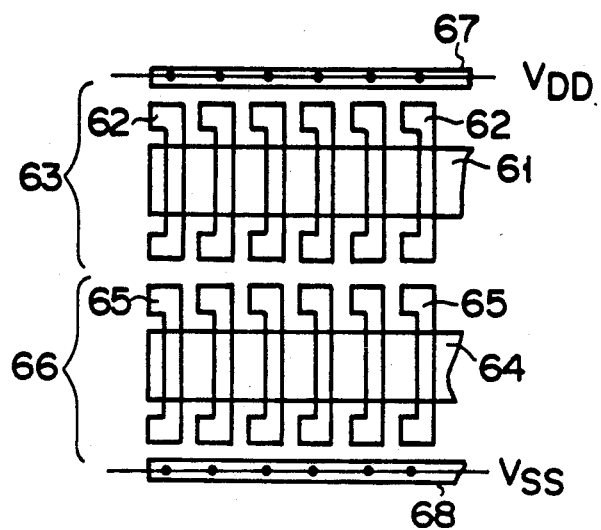
FIG. 7A is a plan view showing a second example of the construction in a no-cell region.
Figure 7B:
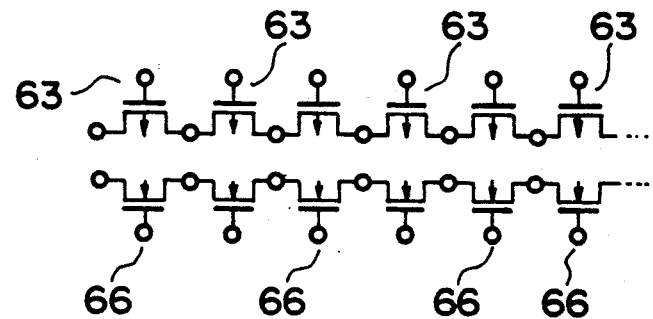
FIG. 7B is a circuit diagram of an equivalent circuit attained by the construction of FIG. 7A.

FIG. 7A is a plan view showing a second example of the construction of MOS transistors formed in the no-cell region 12 and FIG. 7B is a circuit diagram showing an equivalent circuit of the construction shown in FIG. 7A. The construction includes an array of P-channel MOS transistors 63 which are formed of a plurality of gate electrodes 62 formed over a single P-type diffused region 61 and an array of N-channel MOS transistors 66 which are formed of a plurality of gate electrodes 65 formed over a single N type diffused region 64, and an N-type diffused region 67 and a P-type diffused region 68 are formed for applying respective substrate potentials.

Unlike the construction of FIG. 6A in which insulative isolation by a field oxide film or the like is used, in the construction of FIG. 7A, electrical element isolation is attained by applying a potential to the gates so as to set a voltage between the gate and the source to 0 V. That is, the element isolation can be attained by connecting the gate electrodes 62 of the P-channel MOS transistors 63 to the adjacent power source line $V_{DD}$, and connecting the gate electrodes 65 of the N-channel MOS transistors 66 to the adjacent power source line $V_{SS}$.

When a new additional gate circuit is formed by connecting the transistors previously formed in the no-cell region and if a track for permitting the input and output of the gate circuit to be passed over the first-layered power source line running in parallel with the no-cell region and extended to the wiring region is not provided, then the gate circuit cannot be used.

In general, wirings on a chip are densely arranged in the central portion of the chip. Therefore, wiring inhibition regions (no track) which intersect with the power source lines are provided in desired portions over the transistors formed in the no-cell regions arranged in right and left end portions of each chip. With this arrangement, the wiring efficiency in the chip will not be lowered.

Figure 8:
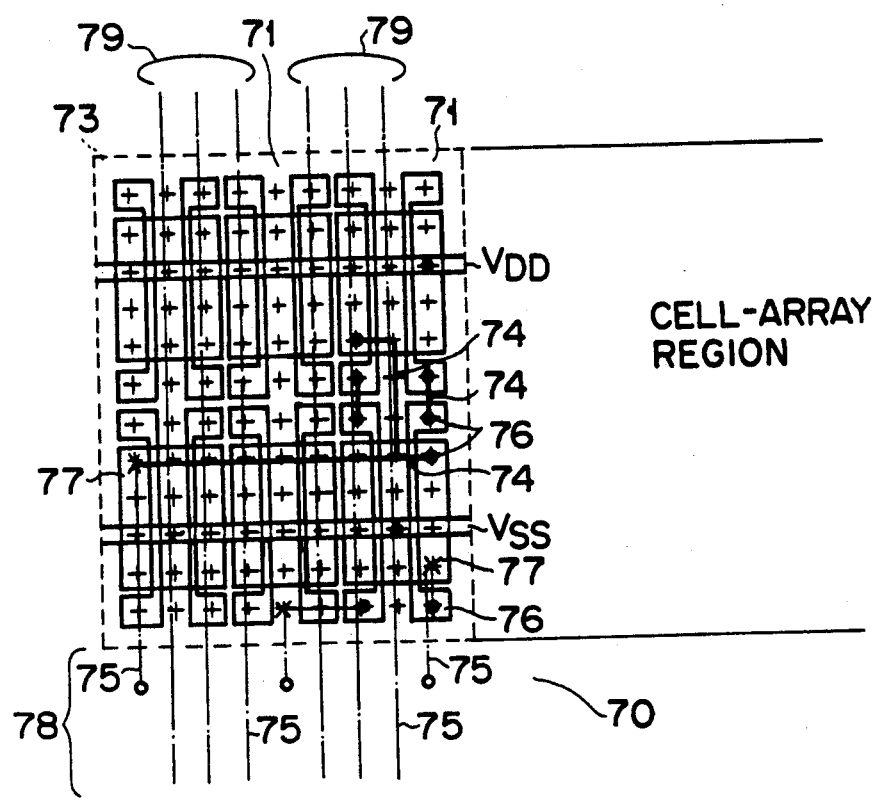
FIG. 8 is a pattern plan view showing the construction in which a wiring inhibition region (no track) is formed in the transistor pattern of FIG. 6A in the no-cell region.

FIG. 8 is a pattern plan view showing the construction in which a wiring inhibition region (no track) is formed in the transistor pattern of FIG. 6A in the no-cell region. In FIG. 8, + marks indicate points (grids) in which the wiring can be made, and each grid row of wiring inhibition region 71 is provided for every four grid rows of wirings.

Figure 5:
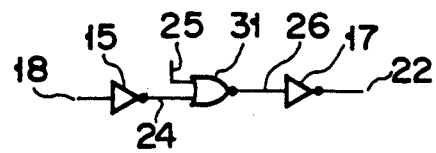
FIG. 5 is a circuit diagram of an equivalent circuit attained by the construction of FIG. 4.

A 2-input NOR gate circuit 70 which is the same as the NOR gate circuit 31 shown in FIG. 5 is formed by a combination of the transistors in a no-cell region 73. First-layered metal wiring lines 74 are indicated by thick solid lines, second-layered metal wiring lines 75 are indicated by one-dot-dash lines, contact holes 76 are indicated by black dots and VIA holes 77 are indicated by x marks. The input and output of the NOR gate circuit 70 are lead out to a wiring region 78 via the second-layered metal wiring lines 75 by use of the wiring inhibition regions 71. The other portions of the second-layered metal wiring lines 75 outside the wiring inhibition regions 71 are used as through wirings 79 connected to other cells (not shown).

As a larger number of wiring inhibition regions 71 are provided, the efficiency of application of the transistors formed in the no-cell regions is enhanced, but the wiring efficiency of the chip is lowered. Therefore, the density of the wiring inhibition regions 71 must be determined by fully taking the above conditions into consideration.

Figure 9:
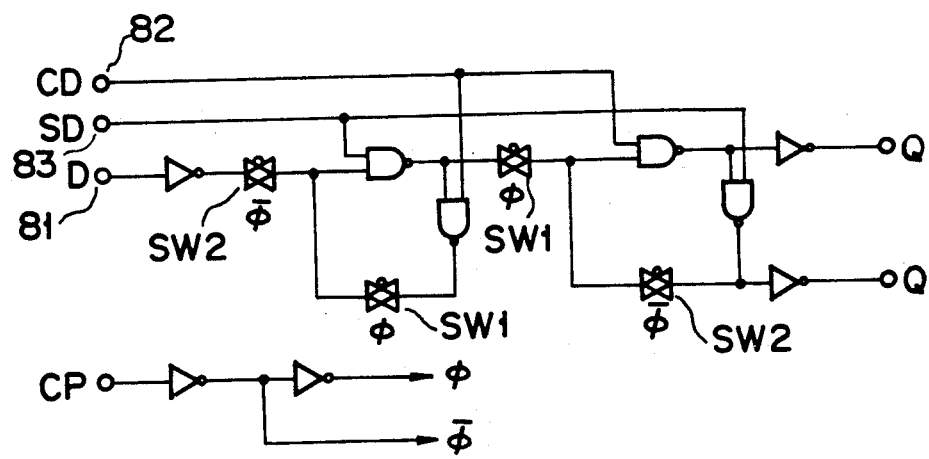
FIG. 9 is a circuit diagram showing an example of the construction of a standard cell arranged in the no-cell region.

Next, assume that a circuit of relatively large scale is constructed by a combination of the basic transistors formed in the no-cell regions as shown in FIGS. 6A and 7A. The result shows that a layout area which is larger than that of a cell having the same function and constructed in the standard cell library becomes necessary. For example, a D-type flip-flop circuit with clear preset as shown in FIG. 9 is used as a basic circuit constituting a sequential logic circuit and is considered to be frequently used. The circuit is constructed by approx. 34 transistor elements. A terminal 81 is supplied with data D. A clear data signal CD input to a terminal 82 causes data in the circuit to be cleared. A set data signal SD input to a terminal 83 permits data to be set in the circuit. SW1 denotes a switch which is set in the ON state by a signal $\phi$ of signals $\overline{\phi}$ and $\phi$ SW2 denotes a switch which is set in the ON state by the signal $\overline{\phi}$.

When the circuit of FIG. 9 is constructed by a combination of the basic transistors in the no-cell regions, it is necessary to use the transistors which are formed in the no-cell regions separately arranged in the cell arrays. This makes it difficult to actually construct the circuit.

Therefore, basic gates of middle or small scale which may be used at the time of design change are previously arranged in the no-cell regions as standard cells and basic cells of transistors may be arranged in other no-cell regions. The types, number and position of the cells prepared as the standard cells must be determined for each case.

According to the above embodiments, even if the design change occurs after the layout design using the standard cells, the input and output of a gate circuit constructed in the no-cell region by using the wiring inhibition region can be lead out without fail. Thus, addition of a circuit or removal or correction of the circuit can be attained by simply correcting part of the layout.

Figure 1:
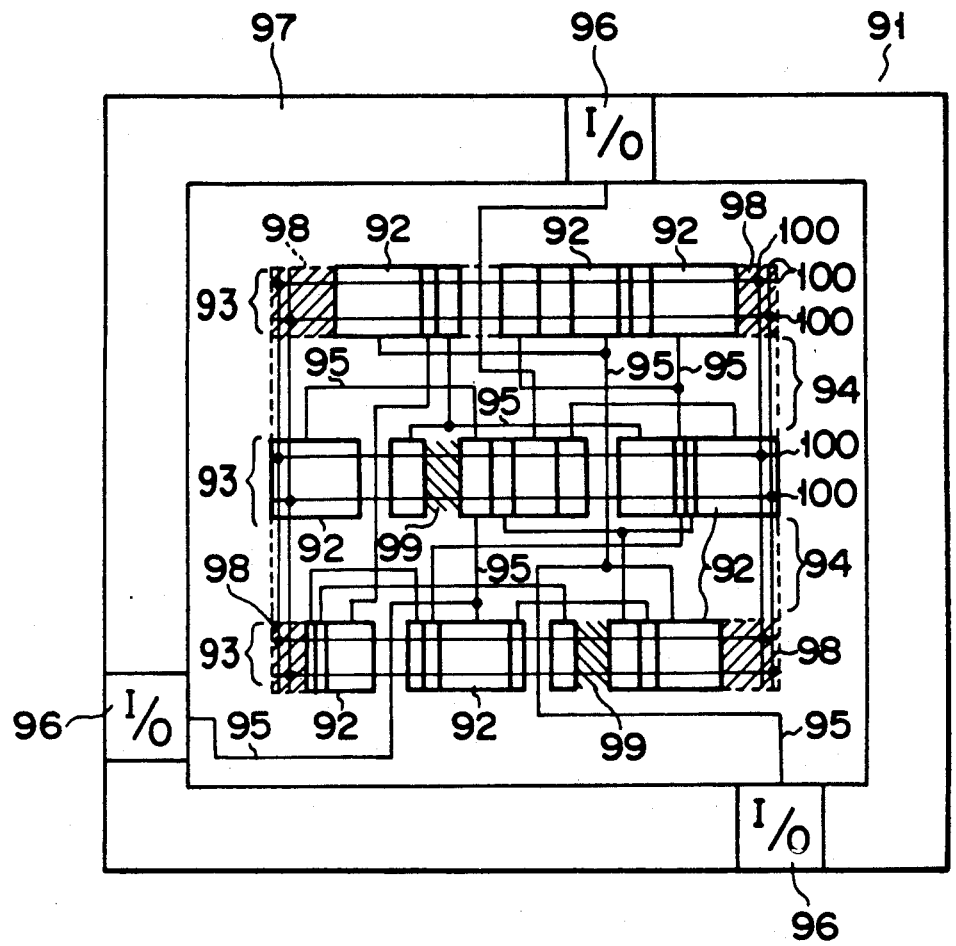
FIG. 1 is a pattern plan view showing the construction of a conventional semiconductor integrated circuit of a standard cell system.

As can be seen from an example of modification of the layout shown in FIG. 2, the number of wirings in the wiring region is increased by the number of wirings necessary for the modification so that wirings including the wirings which are not used for the modification must be re-arranged in some cases. However, as shown in FIG. 1, since the no-cell regions are generally provided on both end portions of the cell array and no-cell regions may be provided inside the cell array, the range of correction of the cell wirings is limited to a local portion by applying this invention. That is, the design change can be economically and efficiently attained by limiting correction of the masks used for manufacturing a chip to a mask used for wiring and used in the step near the final step of the manufacturing process.

Further, since the transistor array previously formed for the design change is arranged in a region which is not used as the no-cell region, the chip area will not be increased.

Figure 10A:
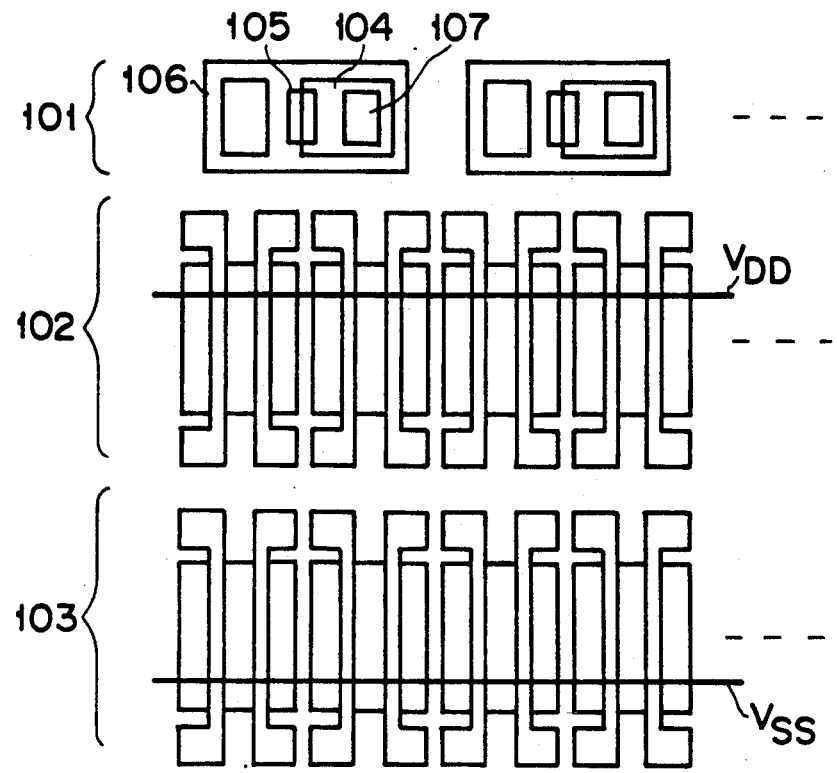
FIG. 10A is a plan view showing a third example of the construction in a no-cell region.
Figure 10B:
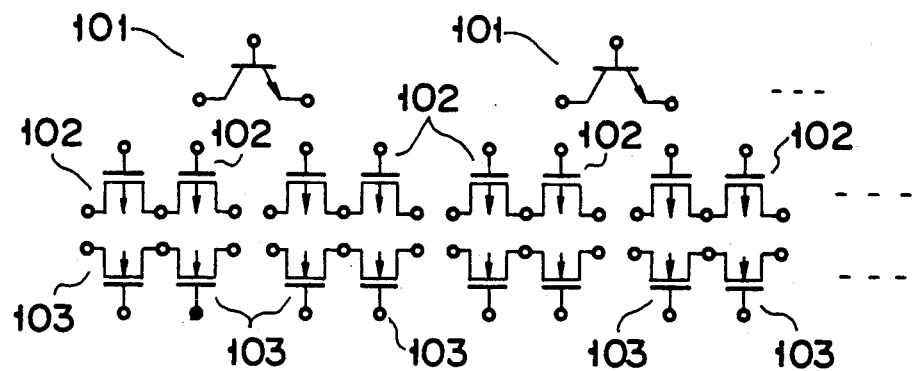
FIG. 10B is a circuit diagram of an equivalent circuit attained by the construction of FIG. 10A.

The transistors formed in the no-cell region are not limited to those shown in the embodiment of FIGS. 6A and 7A, and various modifications can be made. For example, in case of a Bi-CMOS integrated circuit of a standard cell system, referring to FIG. 10A, a desired number of bipolar transistors 101, P-channel MOS transistors 102 and N-channel MOS transistors 103 are previously formed in the no-cell region. Each one of the bipolar transistors 101 has the following configuration. A P-type region 104 serving as a base, and a $P^+$-type region 105 connected to a base terminal is formed in an N-type region 106 serving as a collector. An N+-type region 107 serving as an emitter is formed in the P-type region 104. P-channel MOS transistors 102 and N-channel MOS transistors 103 are the same structure shown in FIG. 6A. FIG. 10B is a circuit diagram showing an equivalent circuit of the construction shown in FIG. 10A.

As described above, according to this invention, addition of a circuit or removal or correction of the circuit can be attained by previously forming the transistors for the design change in the no-cell region and simply correcting part of the wiring of the layout for the design change occurring after the layout design using the standard cells is completed. Further, since the no-cell region is used, the chip area will not be increased. As a result, a semiconductor integrated circuit of standard cell system in which an increase in time and financial burden for the chip development can be suppressed to minimum can be provided.

Additional advantages and modifications will readily occur to those skilled in the art. Therefore, the invention in its broader aspects is not limited to the specific details and representative devices, shown and described herein. Accordingly, various modifications may be without departing from the spirit or scope of the general inventive concept as defined by the appended claims and their equivalents.

What is claimed is:

1. A semiconductor integrated circuit of a standard cell system comprising:
   cell array regions and wiring regions in a standard cell layout;
   transistor elements which are not wired and are previously arranged in a plurality of no-cell regions provided in part of said cell array regions according to an original layout design for standard cells; and
   wiring inhibition regions for inhibiting wirings in the original layout design for standard cells, and provided for extending wirings from said no-cell regions to said wiring regions to permit said transistor elements, which are not initially wired, to be used when a design change is required in said standard cell layout.

2. A semiconductor integrated circuit of a standard cell system according to claim 1, wherein said transistor elements which are not wired are formed of a plurality of insulated gate transistors of first and second conductivity types.

3. A semiconductor integrated circuit of a standard cell system according to claim 1, wherein said no-cell regions are formed in end portions of said cell array regions.

4. A semiconductor integrated circuit of a standard cell system according to claim 1, wherein said no-cell regions are formed in intermediate portions of cell rows of said cell array regions.

5. A semiconductor integrated circuit of a standard cell system according to claim 1, wherein said wiring inhibition regions are each provided for a preset number of wiring grids in which normal wirings are permitted in said standard cell layout.

6. A semiconductor integrated circuit of a standard cell system according to claim 1, wherein standard cells, which are part of said transistor elements are not initially used as basic gates, are arranged in said no-cell regions.

7. A semiconductor integrate circuit of a standard cell system according to claim 1, wherein said no-cell region includes basic gates and transistors of first and second conductivity types which are not initially used and a plurality of transistors of the first and second conductivity types which are not initially used are arranged in another portion of said no-cell regions.

8. A semiconductor integrated circuit of a standard cell system comprising:
   cell array regions and wiring regions in a standard cell layout;
   transistor elements which are not wired and are previously arranged in a plurality of no-cell regions provided in part of said cell array regions according to an original layout design for standard cells;
   wiring means for permitting a desired circuit to be formed in said no-cell region by use of said transistor elements which are not initially wired and making an unnecessary circuit inoperative when a design change is required in said standard cell layout; and
   wiring inhibition regions for inhibiting the original layout design for standard cells, and provided for extending input and output terminals of said desired circuit from said no-cell regions to said wiring regions.

9. A semiconductor integrated circuit of a standard cell system according to claim 8, wherein said transistor elements which are not initially wired are formed of a plurality of insulated gate transistors of first and second conductivity types.

10. A semiconductor integrated circuit of a standard cell system according to claim 8, wherein said no-cell regions are formed in end portions of said cell array regions.

11. A semiconductor integrated circuit of a standard cell system according to claim 8, wherein said no-cell regions are formed in intermediate portions of cell rows of said cell array regions.

12. A semiconductor integrated circuit of a standard cell system according to claim 8, wherein said wiring inhibition regions are each provided for a preset number of wiring grids in which wirings are permitted in the original layout design for standard cells.

13. A semiconductor integrated circuit of a standard cell system according to claim 8, wherein standard cells, which are part of said transistor elements are not initially used as basic gates, are arranged in said no-cell regions.

14. A semiconductor integrated circuit of a standard cell system according to claim 8, wherein said no-cell region includes basic gates and transistors of first and second conductivity types which are not initially used and a plurality of transistors of the first and second conductivity types which are not initially used are arranged in another portion of said no-cell regions.

* * * * *

UNITED STATES PATENT AND TRADEMARK OFFICE
CERTIFICATE OF CORRECTION

PATENT NO. : 5,187,555
DATED : February 16, 1993
INVENTOR(S) : Tadahiro Kuroda et al.

It is certified that error appears in the above-identified patent and that said Letters Patent is hereby corrected as shown below:

Claim 7, column 8, line 8, change "integrate" to --integrated--.

Signed and Sealed this

Twenty-first Day of December, 1993

Attest:

BRUCE LEHMAN

Attesting Officer  Commissioner of Patents and Trademarks